United States Patent
Popa et al.

(10) Patent No.: US 9,429,605 B2
(45) Date of Patent: Aug. 30, 2016

(54) TECHNIQUES FOR DETERMINING A RESISTANCE VALUE

(71) Applicant: Infineon Technologies AG, Neubiberg (DE)

(72) Inventors: Adrian Popa, Bucharest (RO); Valentin Neagu, Cocorastii Mislii (RO); Alexandra-Oana Petroianu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 14/271,649

(22) Filed: May 7, 2014

(65) Prior Publication Data

US 2014/0340100 A1 Nov. 20, 2014

Related U.S. Application Data

(60) Provisional application No. 61/823,134, filed on May 14, 2013.

(51) Int. Cl.
G01R 27/00 (2006.01)

(52) U.S. Cl.
CPC .................................. G01R 27/00 (2013.01)

(58) Field of Classification Search
CPC ...................................................... G01R 27/00
USPC ............................................................ 324/691
See application file for complete search history.

(56) References Cited

U.S. PATENT DOCUMENTS

| | | | |
|---|---|---|---|
| 5,274,577 A | 12/1993 | Hinrichs | |
| 6,099,163 A | 8/2000 | Goodwin | |
| 7,410,293 B1* | 8/2008 | Santurkar | G01K 7/015 327/512 |
| 2004/0105488 A1* | 6/2004 | Felder | G01K 7/22 374/170 |
| 2005/0068214 A1* | 3/2005 | Kim | G01K 1/02 341/144 |
| 2006/0114952 A1* | 6/2006 | Seo | H01S 5/0683 372/33 |
| 2008/0136503 A1* | 6/2008 | Au | H03F 3/45475 327/538 |
| 2008/0278346 A1 | 11/2008 | Eftimie et al. | |
| 2012/0161741 A1* | 6/2012 | Zambetti | G05F 3/262 323/294 |
| 2013/0058378 A1* | 3/2013 | Zambetti | G01K 7/24 374/185 |
| 2013/0314110 A1* | 11/2013 | McNeill | H03M 1/0619 324/705 |

FOREIGN PATENT DOCUMENTS

| | | | |
|---|---|---|---|
| WO | 2006135977 A1 | 12/2006 | |
| WO | 2009145629 A1 | 12/2009 | |

* cited by examiner

*Primary Examiner* — Tung X Nguyen
*Assistant Examiner* — Akm Zakaria
(74) *Attorney, Agent, or Firm* — Eschweiler & Associates, LLC

(57) ABSTRACT

Some embodiments relate to an integrated circuit (IC). The IC determines a time-variant resistance of an sensing resistor, wherein a resistance of the sensing resistor reflects an ambient environmental condition. The IC includes first and second conditioning circuits, an analog to digital conversion (ADC) element, and a logic circuit. The first conditioning circuit provides a first voltage based on the resistance of the sensing resistor, while the second conditioning circuit provides a second voltage based on a resistance of an on-chip reference resistor. The ADC element provides a multi-bit digital value based on a ratio of the first and second voltages. The multi-bit digital value is indicative of the ambient environmental condition measured by the off-chip sensor. A logic circuit selectively adjusts the first and second voltages based on the multi-bit digital value to limit or avoid saturation of the ADC element. Other embodiments are also disclosed.

23 Claims, 3 Drawing Sheets

| Range | Rntc min | Rntc max | Nntc | Nref | Tmin (°C) | Tmax (°C) | delta T (°C) | Rgain |
|---|---|---|---|---|---|---|---|---|
| 1 | 40 Ω | 226 Ω | 0,20 | 0,20 | 115,76 | 200,00 | 84,24 | 3,71E-02 |
| 2 | 215 Ω | 1,33 kΩ | 0,20 | 0,20 | 55,82 | 117,70 | 61,88 | 1,86E-01 |
| 3 | 1,27 kΩ | 7,44 kΩ | 0,80 | 0,80 | 12,98 | 51,14 | 38,17 | 1,10E+00 |
| 4 | 7 kΩ | 41,4 kΩ | 2,00 | 0,80 | 19,90 | 14,30 | 34,20 | 5,99E+00 |
| 5 | 39,33 kΩ | 150 kΩ | 2,00 | 0,80 | -40 | -19,03 | 20,97 | 3,29E+01 |

TECHNIQUES FOR DETERMINING A RESISTANCE VALUE

REFERENCE TO RELATED APPLICATION

This application is a non-provisional of U.S. Provisional Application No. 61/823,134 filed on May 14, 2013.

BACKGROUND

Many sensors provide information in the form of a time-varying resistance. For example, a thermistor is a type of resistor whose resistance varies significantly with temperature. Thermistors are widely used as inrush current limiters, temperature sensors, self-resetting overcurrent protectors, and self-regulating heating elements. A resistance temperature detector (RTD) is another example of a sensor that provides information in the form of a time-varying resistance. RTDs differ from thermistors in that the material used in a thermistor is generally a ceramic or polymer, while an RTD uses pure metals.

Moreover, sensors that provide a time-varying resistance are not limited to those where resistance varies with temperature; and other ambient environmental conditions can also be measured by sensors that use a time-varying resistance. For example, pressure can be measured by pressure transducers, such as in the form of piezoelectric sensors. The piezoresistive effect describes change in the electrical resistivity of a semiconductor when mechanical stress is applied.

Whatever the exact condition being measured, it is important to accurately measure the resistance value of resistors in order to accurately determine the corresponding ambient environmental condition. The present disclosure provides improved techniques for determining such resistance values.

DETAILED DESCRIPTION

Figure 1:
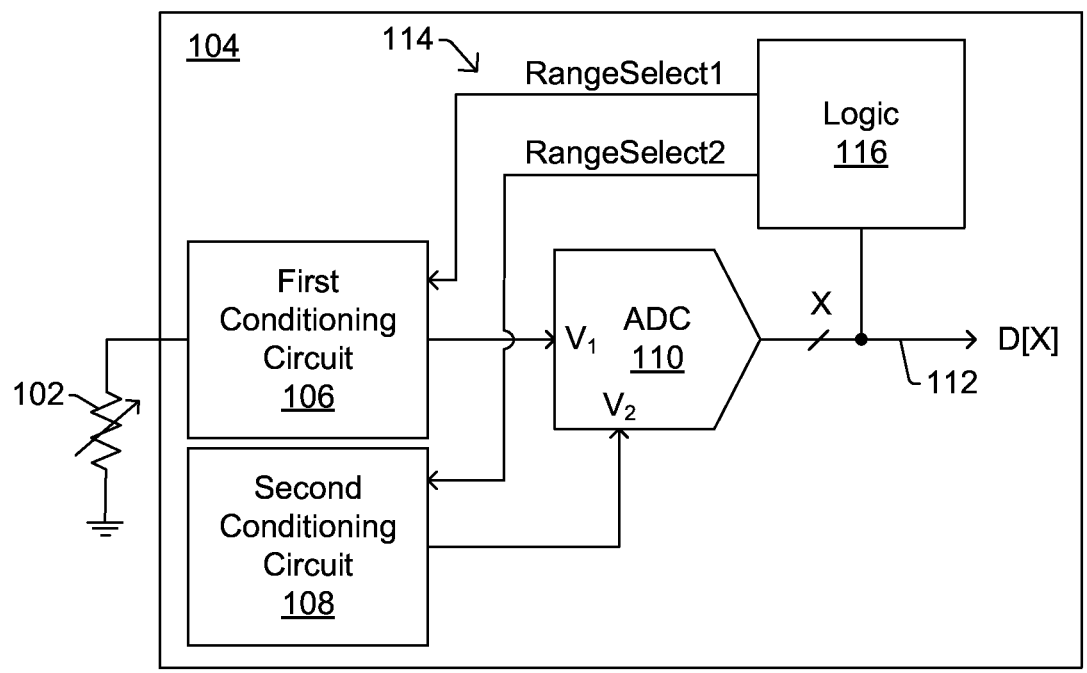
FIG. 1 shows an embodiment of a system for determining a resistance value.

One or more implementations of the present invention will now be described with reference to the attached drawings, wherein like reference numerals are used to refer to like elements throughout. The drawings are not necessarily drawn to scale.

FIG. 1 illustrates a system 100 to measure an ambient environmental condition by using a sensor with a time-varying resistance. In this system, a sensing resistor 102 (e.g., off-chip thermistor) has a resistance value that changes in time to reflect a time-varying, ambient environmental condition near the sensing resistor 102. For example, the resistance could represent an ambient temperature condition, an ambient pressure condition, an ambient optical condition, an ambient ionization condition, or some other ambient environmental condition. Note that although the sensing resistor 102 is illustrated as being off-chip in system 100, sensing resistor 102 could also be arranged on-chip on other embodiments.

To accurately determine the resistance of sensing resistor 102, an integrated circuit (IC) 104 is coupled to the sensing resistor 102. The IC 104 includes first and second conditioning circuits 106, 108. The first and second conditioning circuits 106, 108 have first and second outputs, respectively, which are coupled to first and second inputs of an analog to digital conversion (ADC) element 110. The first conditioning circuit 106 is coupled to the sensing resistor 102 and provides a first voltage V1 to ADC element 110, where a first voltage level of the first voltage V1 is based on the resistance of the sensing resistor 102. The second conditioning circuit 108 provides a second voltage V2 to ADC element, where a second voltage level of the second voltage V2 is based on a resistance of an on-chip reference resistor. The on-chip reference resistor is matched to the sensing resistor 102 and is calibrated to be independent of the ambient environmental condition to be measured. The ADC element 110 provides a multi-bit digital value, D[X], at its output 112, based on differences between V1 and V2. This multi-bit value, D[X], is indicative of the ambient environmental condition measured by the off-chip sensor 102 at a given time.

Notably, rather than being based solely on the first voltage V1 derived from the resistance of sensing sensor 102, the multi-bit digital value provided by ADC element 110 is based on a ratio of the first and second voltages (V1 and V2). This ratioing is useful because, while the sensing resistor 102 has a resistance that changes in time to reflect corresponding changes in the ambient environmental condition, the on-chip reference resistor in second conditioning circuit 108 is calibrated such that the second voltage V2 is a substantially fixed reference voltage that is independent of the ambient environmental condition which the sensing resistor 102 is to measure. Thus, by evaluating differences in resistance between the sensing resistor 102 and on-chip resistor, the IC 104 can accurately determine the ambient environmental condition.

Using the ratio between V1 and V2 (or equivalently between currents $I_1$ and $I_2$ from first and second conditioning circuits 106, 108) is efficient because it provides protection against process variation. If this ratioing technique were not used (e.g., if ADC measurements were made solely on V1 for example), process variation could cause voltage (or current) readings to be different over different manufactured ICs, and this difference could cause inaccuracies in determining the resistance of sensing resistors 102 read by different ICs.

To further improve the accuracy with which the measured ambient environmental condition is determined, a feedback path 114, which includes a logic circuit 116, is included on the IC 104. By making use of the feedback path 114, the logic circuit 116 selectively adjusts the currents provided to the sensing resistor 102 and on-chip resistor based on the multi-bit digital value D[X} on ADC output 112. By tuning these currents, the logic circuit 116 can help to ensure that a continually reasonable current level is provided through the sensing resistor 102 as it changes its resistance over temperature. Thus, for example, as temperature decreases (causing resistance of sensing resistor 102 to increase), the logic circuit 116 can increase the current through sensing resistor 102 to ensure the currently is large enough to provide accurate sensing of the increased sensing resistance. Further, the logic circuit 116 can also selectively adjust the first voltage V1 and/or second voltage V2 based on the multi-bit digital value D[X] on ADC output 112. By tuning V1 and/or V2, the logic circuit 102 can keep the voltage within a desired operating range of the ADC element 110, to help to limit or avoid saturation of the ADC element 110, and thereby further improve accuracy with which the resistance of sensing resistor 102 is determined.

Figures 2, 3:
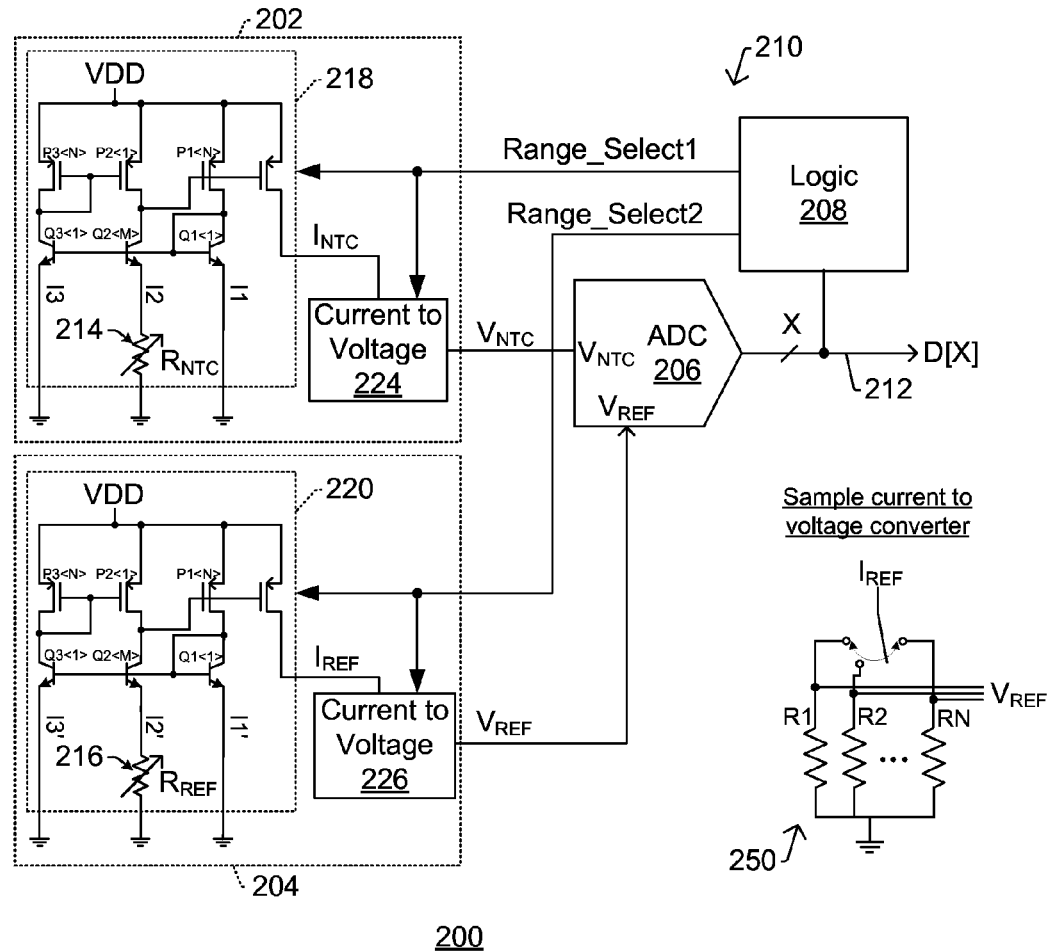
FIG. 2 shows another embodiment of a system for determining a resistance value.
FIG. 3 shows a table of sample values that can be used to tune currents for first and second conditioning circuits to limit or avoid saturation of an ADC element.

FIG. 2 illustrates a more detailed system 200 which includes first and second conditioning circuits (202, 204), ADC element 206, and logic circuit 208. The logic circuit 208 is arranged on a feedback path 210 between a multi-bit digital output 212 and the first and second conditioning circuits (202, 204). A negative temperature coefficient (NTC) resistor 214 can be arranged off-chip, and a reference resistor 216 can be arranged on-chip with the other illustrated components.

The NTC resistor 214 is made of a material whose electrical resistivity is inversely proportional with temperature, typically in a defined temperature range. Thus, by measuring the electrical resistivity of the NTC resistor 214, and comparing the measured resistivity to some expected electrical resistivity curve for the material of the NTC resistor, the system 200 can determine the ambient temperature.

For the first conditioning circuit 202, NTC resistor 214 is included in a first current mirror 218 inside of which the voltages and currents are settled to values dependent of the resistance value of NTC resistor 214 and other physical constants. The current from one leg of the first current mirror (e.g., current I1 on first current leg or current I2 on second current leg) is mirrored as output current ($I_{NTC}$) and converted into a voltage ($V_{NTC}$), which is inversely proportional to the resistance value of the NTC resistor 214.

Similarly, for the second conditioning circuit 204, the reference resistor 216 is included in a second current mirror 220 in a similar manner. The current from one leg of the second current mirror (e.g., current I1' on third current leg or current I2' on fourth current leg) is mirrored as output current ($I_{REF}$) and converted into a voltage ($V_{REF}$). The reference resistor 216 is calibrated during a chip fabrication process so the reference current $I_{ref}$ and reference voltages $V_{ref}$ are substantially independent of changes in the ambient environmental condition measured by NTC resistor 214. For example, if the NTC resistor 216 is to measure temperature, the system 200 can include a separate on-chip temperature sensor to sense an on-chip temperature during operation, and to tune current through the reference resistor 216 to keep $I_{ref}$ (and $V_{ref}$) substantially constant over an operating temperature range of the system. To this end, a memory element in the system (not shown) can store a look-up table of calibration values, and tune current levels through the second current mirror 220 based on measured temperature to keep $I_{ref}$ (and $V_{ref}$) substantially constant over the operating temperature range.

By observing a current or voltage (e.g., $V_{NTC}$) from the first conditioning circuit 202 and comparing it to a current or voltage (e.g., $V_{Ref}$) from the second conditioning circuit 204, the ADC element 206 can provide a multi-bit output, D[X], whose digital value corresponds to the ambient environmental condition (e.g., temperature) measured by the NTC resistor 214. By using a ratio of $V_{NTC}$ and $V_{REF}$, FIG. 2's system provides a significant advantage in process variation independence.

More particularly, the output currents $I_{out}$ (i.e., $I_{ntc}$ and $I_{ref}$ in FIG. 2) can be calculated as follows:

$$I_{out} = \frac{1}{R}\frac{kt}{q}\ln(N \cdot M)$$

where k is Boltzmann's constant, T is the absolute temperature of the IC, q is the elementary charge, R is the resistance value of NTC or reference resistor, M is a bipolar area multiplicity factor and N is a pmos current mirror multiplicity factor within the first or second conditioning circuits 202, 204. In practical implementations, M and N can be realized for each of the first and second conditioning circuits 202, 204 by arranging a first integer number, M, of bipolar transistors in parallel and arranging a second integer number, N, of pmos transistors in parallel within each of the first and second conditioning circuits 202, 204.

Furthermore, in order to have a linear dependency on the NTC resistance, the ratio of reference and NTC currents is evaluated by the ADC element as follows:

$$\frac{I_{ref}}{I_{NTC}} = \frac{\frac{V_T}{R_{REF}}\ln(M_{REF} \cdot N_{REF})}{\frac{V_T}{R_{NTC}}\ln(M_{NTC} \cdot N_{NTC})} = \frac{R_{NTC}}{R_{REF}}$$

where $V_T = kT/q$.

The output currents ($I_{ref}$, $I_{NTC}$) from the first and second conditioning blocks are furthermore converted into voltages by first and second current to voltage converters (222, 224, respectively) and used as inputs for the ADC element.

$$V_{NTC} = I_{NTC} \cdot R_{I2V\_NTC}$$

and $$V_{REF} = I_{REF} \cdot R_{I2V\_REF}$$

$$V_{NTC} = R_{ref} \cdot \frac{I_{ref}}{I_{NTC}} = Rgain \cdot Rref \cdot \frac{V_{ref}}{V_{NTC}}$$

where $R_{gain}$ is the ratio of the current to voltage conversion resistors:

$$Rgain = \frac{R_{I2V\_ntc}}{R_{I2V\_ref}}$$

For the ADC element 206 to consistently operate in its most linear region, the logic circuit 208 evaluates the multi-bit digital value D[X] to determine if the multi-bit digital value falls within a plurality of predetermined resistance ranges. The logic circuit 208 can induce different electrical characteristics for each of the first and second conditioning circuits 202, 204 for each range, wherein the selected electrical characteristics for the first and second conditioning circuits are based on which predetermined resistance range the multi-bit digital value falls into at a given time.

For example, to keep an appropriate current passing through $R_{NTC}$, Range_Select1 and Range_Select2 in FIG. 2 act as control signals to tune the current along the current legs of the first and second current mirrors 218, 220 through $R_{NTC}$, $R_{REF}$. This can be achieved by Range_Select1 and Range_Select2 enabling different numbers of bipolar and/or pmos transistors in the current mirrors based on the multi-bit digital value to achieve different M factors and/or N factors to "tune" $I_{ntc}$ and $I_{ref}$. Further, Range_Select1 and Range_Select2 can also change the gains or resistances of first and second current to voltage elements 224, 226, thereby tuning VNTC and VREF; to limit saturation of ADC element 206.

A description of one example of range separation and limits can be found in the table illustrated in FIG. 3. To better explain how FIG. 2's system 200 operates in light of FIG. 3's table, an example is now discussed. This example shows five discrete ranges of operation which help limit ADC saturation, compared to examples where only one range is used. For simplicity, this example only illustrates changes in the N multiplicity factors (e.g., number of PMOS transistors used to provide current for the first and second conditioning circuits), and assumes the M multiplicity factors are constant (e.g., number of BJTs providing current is fixed for the first and second conditioning circuits 202, 204). However, it will be appreciated that other embodiments could tune the M multiplicity factors and leave the N multiplicity factors fixed, or could change the M-multiplicity factors as well as the N-multiplicity factors. Further, the present disclosure is not limited to the use of five discrete ranges, but any number of discrete ranges can be used.

Consider that at a first time in this example, the ambient temperature near the NTC resistor 214 is 100° C. In looking at the second line (302) of FIG. 3's table, we can see that the resistance of the NTC resistor 214 is relatively low at this temperature (between 215 and 1.3 k). Hence, the ADC element 206 will output a multi-bit value, D[X], which can be a 12-bit word that ranges from 0000_0000_0000 to 1111_1111_1111 over this second resistance range and which reflects the measured NTC value, and the logic element 208 will set the N multiplicity factors $N_{NTC}$ and $N_{REF}$ values to 0.20 and 0.20, respectively, as seen in FIG. 3's table.

If the ambient temperature decreases but remains between 55.82° C. and 117.70° C., the resistance of the NTC resistor 214 will increase and the ADC element 206 will correspondingly update the multi-bit value, D[X], to reflect this increased NTC resistance value. So long as the multi-bit value, D[X], indicates that the NTC resistance value remains within a single one of the five discrete ranges, the logic circuit 208 keeps the N-multiplicity factors unchanged for the first and second conditioning circuits 202, 204. Thus, if the ambient temperature drops to 56° C., the logic circuit 208 will still maintain the $N_{NTC}$ and $N_{REF}$ values at 0.20 and 0.20, respectively.

However, when the ambient temperature changes over to the next discrete range as evidenced by the multi-bit digital value D[X], the logic circuit 208 then induces a change in the N-multiplicity factors to limit saturation of the ADC element 206. Essentially, to keep the voltage $V_{NTC}$ within desired operating region of ADC element 206, the gain or resistance of current to voltage converters 224, 226 can be changed to re-zero the present $V_{NTC}$ at the baseline operating voltage and divide the next discrete range into 2^12 discrete resistance values (i.e., digital output values of 0000_0000_0000 to 1111_1111_1111 over the next discrete resistance range). For example, if the ambient temperature continues to fall to 50° C., the resistance of NTC resistor 214 will increase to about 1.3 kOhm, as can be seen from the third line (304) of FIG. 3's table. This will correspondingly change the ratio between $V_{NTC}$ and $V_{REF}$, and the ADC element 206 will correspondingly update D[X] to reflect the increased NTC resistance (again, over a full range of digital ADC output values for this third range). Upon seeing the switch to the third discrete range, the logic circuit 208 changes the $N_{NTC}$ and $N_{REF}$ values to 0.8 and 0.8, respectively, as can be seen in FIG. 3. This increases the currents $I_{NTC}$, $I_{REF}$ so they stay within regulated levels.

If the ambient temperature decreases further, the resistance of the NTC resistor 214 will further increase and the ADC element 206 will correspondingly update the multi-bit value to reflect this further increased NTC resistance value. Thus, when the ambient temperature changes over to the next, e.g., fourth, discrete range as evidenced by the multi-bit digital value, the logic circuit 208 then induces another change in the N-multiplicity factors to keep current through RNTC at reasonable levels. For example, if the ambient temperature continues to fall to 0° C. (within the fourth line 306 of FIG. 3's table), the resistance of NTC resistor will increase to more than 20 kOhm. Upon seeing the D[X] value is approaching the fourth discrete range, the logic circuit 208 changes the $N_{NTC}$ and $N_{REF}$ values to 2.00 and 0.8, respectively, and changes the gains/resistances of the current to voltage converters 224, 226 to re-zero the present $V_{NTC}$ at the baseline operating voltage and divide the fourth discrete range into 2^12 discrete resistance values (i.e., digital output values of 0000_0000_0000 to 1111_1111_1111 over the fourth discrete resistance range).

Thus, the logical circuit 208 provides a control signal e.g., Range_Select_1 and Range_Select_2, to selectively enable different numbers of transistors within first and second current mirrors 218, 220 for different corresponding multi-bit digital values. For a first multi-bit digital value, the first and second paths each have a first number of transistors enabled (e.g, Range 2: $N_{NTC}=N_{ref}=0.20$), and for a second different multi-bit digital value the first and second paths have a third number and fourth number of transistors being enabled (Range 3 or Range 4). The transition from the second range to the third range illustrates an example where the third and fourth numbers are the same (i.e., 0.80 and 0.80 for $N_{NTC}$ and $N_{REF}$), but are each different from the first number. Thus, the transition from the third range to the fourth range illustrates an example where a third number is the same as a first number (i.e., both are 0.80), but different from the fourth number (i.e., 2.0).

Similarly, the control signal, e.g., Range_Select1 and Range_Select2 also changes the resistance or gain of the current to voltage converters 224, 226 to keep VNTC within the desired operating input range of the ADC element 206. For example, as shown by numeral 250 in FIG. 2, the gain or resistance of current to voltage converters 224, 226 can be changed by changing a resistance value through which the reference or NTC current passes. In the circuit 250, R1, R2, and RN can each have a different value, and the Range_Select control signal can control switching element to control which resistor $I_{Ref}$ (or $I_{NTC}$, not illustrated) passes.

Figure 4:
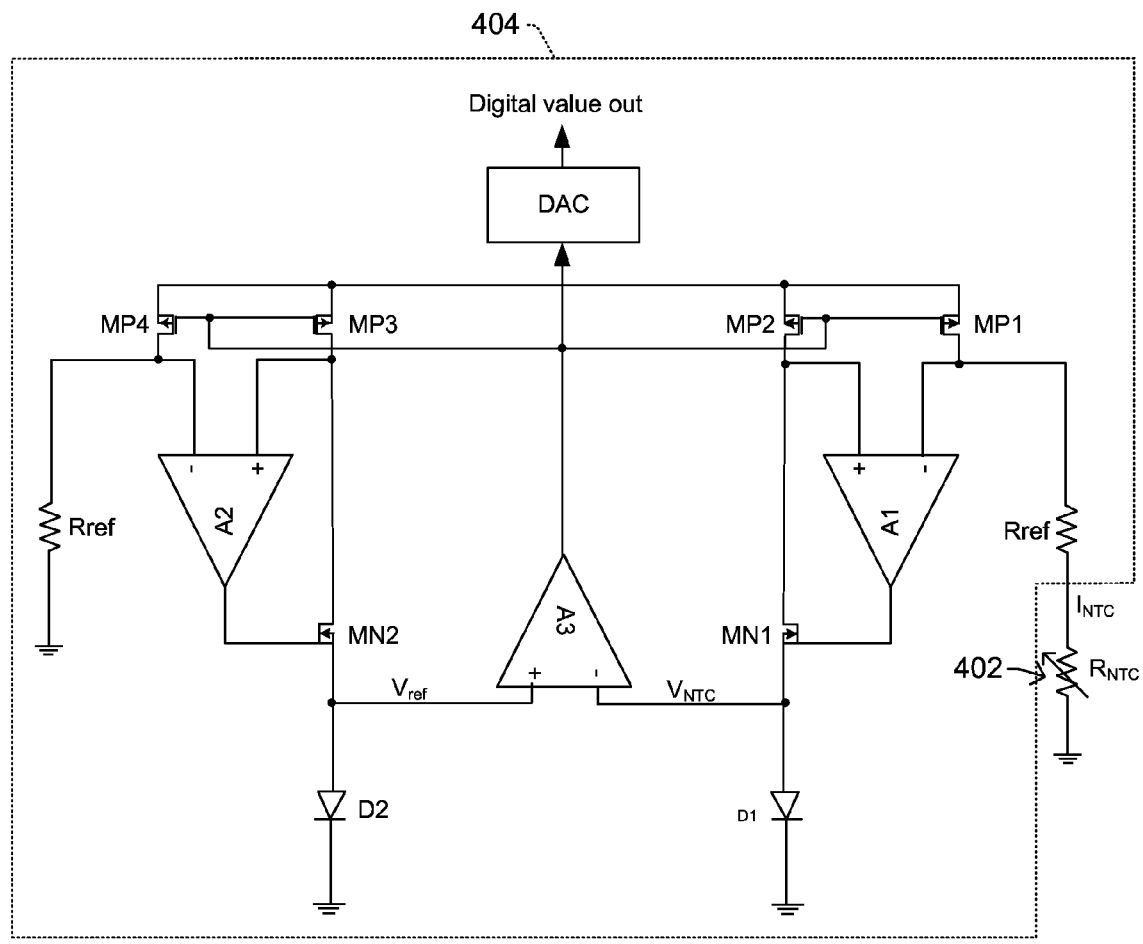
FIG. 4 shows another embodiment of a system for determining a resistance value.

FIG. 4 shows another embodiment of a system 400 for determining a resistance, such as a resistance of a NTC sensor 402. Like the previous embodiments, this embodiment can be implemented as an IC 404, wherein a pin of the IC is coupled to one terminal of NTC resistor 402 and the other terminal of the NTC resistor is coupled to ground. The system 400 can also be implemented as stand-alone components, for example, arranged on a breadboard.

The system includes amplifiers A1, A2, and A3, and reference resistors RRef. Amplifier A1 establishes a sensed current value, INTO, representing the resistance value of RNTC, and Amplifier A2 establishes a reference current value, IREF. These currents are converted to voltages VNTC and Vref, and are supplied to inputs of amplifier A3. Amplifier A3 then provides an output whose level is indicative of a difference or ratio between Vref, and VNTC. Because Vref is calibrated to be largely independent of temperature, this difference or ratio between Vref and VNTC is indicative of the change in resistance of RNTC due to temperature change. ADC element then converts this voltage from A3 to a multi-bit digital value, which is indicative of the resistance of RNTC.

More particularly, amplifier A1 keeps sources, gates and drains of MP1, MP2 at the same potential, such that the current through diode D1 equals the current through the external resistor NTC. In the same way, amplifier A2, transistors MP3, MP4, MN2, resistor Rref, and diode D2 generate a reference current through D2. Amplifier A3 has as inputs the voltages on the diodes D1 and D2 and its output controls the gates of the PMOS transistors (MP1-MP4) used to mirror the reference current and the NTC current. By setting the value of the resistor Rref the current limit through the NTC is settled, for example to a current value where self heating effects are less than a threshold value. When the current value exceeds this threshold value (i.e., when self heating effects become significant), a warning signal can be generated. The correct reading of the NTC is done as long as this limitation doesn't appear.

It will be appreciated that the embodiments illustrated and described above are but a few examples contemplated as falling within the scope of the present disclosure. For example, although the transistors in FIG. 2 have been shown as MOS-type devices or bipolar junction transistors (BJTs), other types of transistors could also be used in place of the illustrated transistors. For example, BJTs could be substituted for the MOS-type devices, or vice versa, and other type of transistors such as JFETs, HEMTs, or FinFETs, for example could also be used. In addition, although the illustrated circuit examples show p-type devices and/or n-type devices, for example, it will be appreciated that the polarities of these devices can be switched in other embodiments along with a corresponding change in applied biases. Other combinations are also contemplated as falling within the scope of this disclosure.

Thus, some embodiments disclosed herein relate to an integrated circuit (IC) for determining a time-variant resistance of a sensing resistor. A resistance of the sensing resistor at a given time reflects an ambient environmental condition near the sensing resistor at that time. The IC includes a first conditioning circuit to provide a first voltage based on the resistance of the sensing resistor, and a second conditioning circuit to provide a second voltage based on a resistance of an on-chip reference resistor. An ADC element provides a multi-bit digital value based on a ratio of the first and second voltages. The multi-bit digital value is indicative of the ambient environmental condition measured by the sensing resistor. A logic circuit selectively adjusts the first and second voltages based on the multi-bit digital value to limit or avoid saturation of the ADC element.

Other embodiments relate to an apparatus. The apparatus includes a sensor having a time-varying resistance, wherein a resistance of the sensor at a given time reflects an ambient environmental condition near the sensor at that time. A first circuit provides a first voltage based on the resistance of the sensor. A second circuit provides a second voltage which has a substantially fixed voltage level that is independent of changes in the ambient environmental condition. An ADC element provides a multi-bit digital value based on a ratio of the first and second voltages. The multi-bit digital value is indicative of the resistance of the sensor and a corresponding ambient environmental condition. A logic circuit selectively adjusts the first and second voltages independent of one another based on the multi-bit digital value.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit (IC) for determining a time-variant resistance of a sensing resistor, wherein a resistance of the sensing resistor at a given time reflects an ambient environmental condition near the sensing resistor at that time, the IC comprising:
   a first conditioning circuit to provide a first voltage based on the resistance of the sensing resistor, the sensing resistor having a negative temperature coefficient;
   a second conditioning circuit to provide a second voltage based on a resistance of an on-chip reference resistor;
   an analog to digital conversion (ADC) element configured to concurrently receive the first and second voltages and provide a multi-bit digital value based on a ratio of the first and second voltages, the multi-bit digital value indicative of the ambient environmental condition measured by the sensing resistor; and
   a logic circuit to selectively adjust the first and second voltages based on the multi-bit digital value to limit or avoid saturation of the ADC element.

2. The IC of claim 1, where the logic circuit evaluates the multi-bit digital value to determine if the multi-bit digital value falls within a plurality of predetermined resistance ranges, and wherein the logic circuit induces different electrical characteristics for each of the first and second conditioning circuits based on which predetermined range the multi-bit digital value falls into at a given time.

3. The IC of claim 2, wherein the first and second voltages are increased in discrete amounts as the resistance steppedly decreases from one predetermined resistance range to another predetermined resistance range.

4. The IC of claim 3, wherein the logic circuit increases the first and second voltages independently of one another based on the multi-bit digital value.

5. The IC of claim 1, wherein the first conditioning circuit comprises:
   a first current mirror including first and second current paths, wherein the sensing resistor is coupled to the second current path and helps to establish a first control voltage on the second current path that sets a first current; and
   a first current to voltage converter to convert the first current to the first voltage.

6. The IC of claim 5, wherein the logical circuit provides a first control signal to tune the first current based on the multi-bit digital value.

7. The IC of claim 5, wherein the first current mirror comprises a first plurality and a second plurality of transistors arranged in parallel with one another on the first and second current paths, respectively, wherein individual transistors of the first and second plurality of transistors are independently enableable to provide different currents corresponding to different multi-bit digital values.

8. The IC of claim 7, wherein the logical circuit provides a first control signal to selectively enable different numbers of transistors for different corresponding multi-bit digital values.

9. The IC of claim 7, wherein the second conditioning circuit comprises:
   a second current mirror including third and fourth current paths, wherein the reference resistor is coupled to the fourth current path and helps to establish a second control voltage on the fourth current path that sets a second current; and
   a second current to voltage converter to convert the second current to the second voltage.

10. The IC of claim 9, wherein the logical circuit provides a second control signal to tune the second current based on the multi-bit digital value.

11. The IC of claim 9, wherein the second current mirror comprises a third and a fourth plurality of transistors arranged in parallel with one another on the third and fourth current paths, respectively, wherein individual transistors of the third and fourth plurality of transistors are independently enableable to provide different currents corresponding to different multi-bit digital values.

12. The IC of claim 10, wherein the logical circuit provides a first control signal to selectively enable different numbers of transistors for different corresponding multi-bit digital values.

13. The IC of claim 10, wherein for a first multi-bit digital value, the first and second paths each have a first number of transistors enabled, and for a second different multi-bit digital value the first and second paths have a third number and fourth number of transistors being enabled.

14. The IC of claim 13, wherein the third and fourth numbers are the same, but are each different from the first number.

15. The IC of claim 13, wherein the third number is the same as the first number, but different from the fourth number.

16. The IC of claim 1, wherein the second conditioning circuit comprises:
   a first temperature sensing element to sense an on-chip temperature; and
   a calibration element to tune current through the reference resistor to keep a reference current constant over ambient condition range.

17. The IC of claim 16, further comprising: a memory element to store a look-up table of calibration values based on measured temperature.

18. The IC of claim 16, wherein the sensing resistor is an off-chip resistor with a negative temperature coefficient, where the integrated circuit is configured to determine a resistance value of the off-chip resistor to determine an ambient temperature being experienced by the off-chip resistor.

19. An apparatus, comprising:
   a sensing resistor having a time-varying resistance exhibiting a negative temperature coefficient, wherein a resistance of the sensing resistor at a given time reflects an ambient environmental condition near the sensing resistor at that time;
   a first conditioning circuit to provide a first current to the sensing resistor and to output a first voltage based on the resistance of the sensing resistor;
   a second conditioning circuit to provide a second current to a reference resistor and to output a second voltage which has a substantially fixed voltage level, the reference resistor being matched to the sensing resistor;
   an analog to digital conversion (ADC) element configured to concurrently receive the first and second voltages and provide a multi-bit digital value based on a ratio of the first and second voltages, the multi-bit digital value indicative of the resistance of the sensing resistor and a corresponding ambient environmental condition; and
   a logic circuit arranged on a feedback path between an output of the ADC element and respective inputs of the first and second conditioning circuits and adapted to selectively adjust the first and second currents as well as the first and second voltages based on the multi-bit digital value.

20. The apparatus of claim 19, wherein the second conditioning circuit is coupled to a reference resistor that emulates a temperature-invariant resistor.

21. The apparatus of claim 20, where the logic circuit evaluates the multi-bit digital value to determine if the multi-bit digital value falls within a plurality of predetermined resistance ranges, and wherein the logic circuit induces different electrical characteristics for each of the first and second conditioning circuits based on which predetermined range the multi-bit digital value falls into at a given time.

22. The IC of claim 1, further comprising:
   a first amplifier to provide the first voltage;
   a second amplifier to provide the second voltage substantially independent of changes in the ambient environmental condition near the sensing resistor; and
   a third amplifier to provide an output signal whose voltage level is indicative of the ambient environmental condition, wherein the output signal is based on the first voltage and the second voltage; and
   wherein the ADC element is configured to provide the multi-bit digital value based on the output signal, the multi-bit digital value indicative of the ambient environmental condition measured by the sensing resistor.

23. The apparatus of claim 19, further comprising:
   a first amplifier to provide the first voltage;
   a second amplifier to provide the second voltage substantially independent of changes in the ambient environmental condition near the sensing resistor; and
   a third amplifier to provide an output signal whose voltage level is indicative of the ambient environmental condition, wherein the output signal is based on the first voltage and the second voltage; and
   wherein the ADC element configured to provide a multi-bit digital value based on the output signal, the multi-bit digital value indicative of the ambient environmental condition measured by the sensing resistor.

* * * * *